(12) United States Patent
Zhao et al.

(10) Patent No.: US 12,094,624 B2
(45) Date of Patent: Sep. 17, 2024

(54) LAMINATION STRUCTURE OF SECOND GENERATION HIGH-TEMPERATURE SUPERCONDUCTING (2G-HTS) TAPE AND METHOD FOR FABRICATING THE SAME

(71) Applicant: SuperMag Technology (Shanghai) Ltd., Shanghai (CN)

(72) Inventors: Yue Zhao, Shanghai (CN); Chunjiang Guo, Shanghai (CN); Yue Wu, Shanghai (CN); Wei Wu, Shanghai (CN)

(73) Assignee: SuperMag Technology (Shanghai) Ltd., Shanghai (CN)

( * ) Notice: Subject to any disclaimer, the term of this patent is extended or adjusted under 35 U.S.C. 154(b) by 0 days.

(21) Appl. No.: 18/489,634

(22) Filed: Oct. 18, 2023

(65) Prior Publication Data

US 2024/0274326 A1    Aug. 15, 2024

(51) Int. Cl.
| | |
|---|---|
| *H01B 12/00* | (2006.01) |
| *B23K 1/08* | (2006.01) |
| *B23K 1/20* | (2006.01) |
| *H01B 12/02* | (2006.01) |
| *H10N 60/85* | (2023.01) |
| *B23K 101/34* | (2006.01) |
| *B23K 101/38* | (2006.01) |
| *B23K 103/04* | (2006.01) |
| *B23K 103/12* | (2006.01) |

(52) U.S. Cl.
CPC ............ *H01B 12/02* (2013.01); *B23K 1/08* (2013.01); *B23K 1/20* (2013.01); *H10N 60/85* (2023.02); *B23K 2101/35* (2018.08); *B23K 2101/38* (2018.08); *B23K 2103/05* (2018.08); *B23K 2103/12* (2018.08)

(58) Field of Classification Search
CPC .......... H01B 12/02; H10N 60/85; B23K 1/08; B23K 1/20; B23K 2103/05; B23K 2103/12; B23K 2101/35; B23K 2101/38
See application file for complete search history.

(56) References Cited

U.S. PATENT DOCUMENTS

| | | | | |
|---|---|---|---|---|
| 2009/0209429 | A1* | 8/2009 | Bhattacharya | ..... H10N 60/0716 205/183 |
| 2009/0233800 | A1* | 9/2009 | Huang | ............... H10N 60/0716 427/63 |
| 2015/0065351 | A1* | 3/2015 | Wang | ................. H10N 60/0801 428/457 |

FOREIGN PATENT DOCUMENTS

| | | |
|---|---|---|
| CN | 107103957 A | 8/2017 |
| CN | 108223518 A | 6/2018 |
| CN | 113593767 A | 11/2021 |

(Continued)

*Primary Examiner* — Pete T Lee

(57) ABSTRACT

A method for fabricating a lamination structure of a second-generation high-temperature superconducting (2G-HTS) tape is provided. Suitable lamination tapes are selected and subjected to local oxidation on side to form a locally oxidized region having a target pattern. The lamination tapes and a to-be-laminated 2G-HTS tape are sequentially arranged, where the locally-oxidized side of each of the lamination tapes faces toward the 2G-HTS tape. The lamination tapes and the to-be-laminated 2G-HTS tape are simultaneously immersed in a molten solder pool, and subjected to reel-to-reel squeezing lamination to form the desired lamination structure. A lamination structure fabricated by the method is also provided.

8 Claims, 5 Drawing Sheets

(56) References Cited

FOREIGN PATENT DOCUMENTS

| | | |
|---|---|---|
| CN | 114038620 A | 2/2022 |
| WO | 2014008384 A1 | 1/2014 |

\* cited by examiner

LAMINATION STRUCTURE OF SECOND GENERATION HIGH-TEMPERATURE SUPERCONDUCTING (2G-HTS) TAPE AND METHOD FOR FABRICATING THE SAME

CROSS-REFERENCE TO RELATED APPLICATIONS

This application claims the benefit of priority from Chinese Patent Application No. 202310034549.1, filed on Jan. 10, 2023. The content of the aforementioned application, including any intervening amendments made thereto, is incorporated herein by reference in its entirety.

TECHNICAL FIELD

This application relates to superconducting materials, and more particularly to a lamination structure of a second generation high-temperature superconducting (2G-HTS) tape and a method for fabricating the same.

BACKGROUND

The 2G-HTS tape is a practical superconductor material with rare-earth barium copper oxide ($REBa_2Cu_3O_{6+x}$ or REBCO, where RE is a rare earth element) as a core functional layer, which has advantages of high transition temperature, high in-field current carrying capacity and excellent mechanical properties. The 2G-HTS tape is considered as one of the most promising practical superconductors and has been extensively employed in the fields of electricity and magnets.

Superconducting devices fabricated from the 2G-HTS tapes will subject to complex stress/strain during service, including mechanical stress, electromagnetic stress, and thermal stress. REBCO materials have typical oxide ceramic properties, and are very sensitive to stress/strain. When the applied stress/strain exceeds the critical stress/strain, macroscopic defects will occur in the superconducting layer of the 2G-HTS tape, including but not limited to cracks and delamination, which will lead to irreversible attenuation in the overall critical current of the superconducting tape, thereby seriously affecting the operation reliability of the superconducting devices.

Intrinsically, the critical tensile strain of the REBCO superconducting layer is significantly lower than its critical compressive strain, and thus more attention should be paid to the tensile properties of the 2G-HTS tape, such as irreversible tensile strain.

In order to better study the influence of tensile strain on the critical current of the 2G-HTS tape, a universal tensile machine is used to evaluate elector-mechanical properties of the 2G-HTS tape under uniaxial tensile strain at the liquid nitrogen temperature or below, so as to determine an irreversible tensile strain of the 2G-HTS tape, namely, the maximum tensile strain under which the critical current after unloading is greater than 99% of the initial critical current. FIG. 3 shows the critical current retention rate of the existing 2G-HTS tapes under different tensile strains. The critical current retention rate is a ratio of the critical current under the tensile strain to the initial critical current. In FIG. 3, the solid line represents the strain loading process; the dotted lines represent the strain unloading process; and the right ends of the dotted lines are the critical current retention rates after the strain is completely unloaded. It can be seen that the irreversible compressive strain of the existing 2G-HTS tapes is about 0.45%, which seriously restricts the application of 2G-HTS tapes.

SUMMARY

An object of the disclosure is to provide a lamination structure of a second-generation high-temperature superconducting (2G-HTS) tape and a method for fabricating the same to overcome the technical defects existing in the prior art.

In a first aspect, a lamination structure of a 2G-HTS tape is provided, comprising a lamination tape group and a to-be-laminated 2G-HTS tape; wherein the lamination tape group comprises a first lamination tape and a second lamination tape; the first lamination tape, the to-be-laminated 2G-HTS tape and the second lamination tape are connected through a solder; and a side of the first lamination tape facing toward the to-be-laminated 2G-HTS tape is provided with a first locally oxidized region, and a side of the second lamination tape facing toward the to-be-laminated 2G-HTS tape is provided with a second locally oxidized region.

In a second aspect, a method for fabricating the lamination structure of the second-generation HTS tape is provided, comprising:

(S1) selecting a first lamination tape and a second lamination tape according to a specification of a to-be-laminated 2G-HTS tape;

(S2) subjecting one side of the first lamination tape and one side of the second lamination tape to local oxidation respectively to obtain a first locally oxidized region with a first locally oxidized pattern and a second locally oxidized with a second locally oxidized pattern;

(S3) sequentially arranging the first lamination tape, the to-be-laminated 2G-HTS tape, and the second lamination tape, wherein the side of the first lamination tape locally oxidized faces towards the to-be-laminated 2G-HTS tape, and the side of the second lamination tape locally oxidized faces toward the to-be-laminated 2G-HTS tape; and (S4) immersing the first lamination tape, the to-be-laminated 2G-HTS tape and the second lamination tape simultaneously in a molten solder pool followed by reel-to-reel squeezing lamination to form the lamination structure.

In some embodiments, in step (S1), the first lamination tape and the second lamination tape are independently made of brass, copper or stainless-steel.

In some embodiments, in step (S1), the to-be-laminated 2G-HTS tape has a thickness of 20-150 μm and a width of 2-12 mm; and the first lamination tape and the second lamination tape each have a thickness of 50-150 μm, and a width of each of the first lamination tape and the second lamination tape is 0.5-3 mm larger than that of the to-be-laminated 2G-HTS tape.

In some embodiments, in step (S2), the local oxidation comprises: dip-coating the first lamination tape and the second lamination tape in an organic protective solution to form a first organic protective layer and a second organic protective layer, respectively, locally etching the first organic protective layer at one side of the first lamination tape to form a first locally oxidized pattern, and locally etching the second organic protective layer at one side of the second lamination tape to form a second locally oxidized pattern; and performing local thermal oxidation on an etched side of the first lamination tape to form a first locally oxidized layer followed by removal of the first organic protective layer to obtain the first lamination tape with the first locally oxidized pattern on one side; and performing local thermal oxidation on an etched side of the second lamination tape to form a second locally oxidized layer followed by removal of the second organic protective layer to obtain the second lamination tape with the second locally oxidized pattern on one side.

In some embodiments, in step (S2), each of the first locally oxidized pattern and the second locally oxidized pattern is a combination of lattice and line segment; an area of the first locally oxidized pattern accounts for 5%-20% of an area of the first lamination tape, and an area of the second locally oxidized pattern accounts for 5%-20% of an area of the second lamination tape; the first locally oxidized pattern is located at a middle of the first lamination tape, and the second locally oxidized pattern is located at a middle of the second lamination tape; and a width of the first locally oxidized region and a width of the second locally oxidized region are each 0.2-1 mm smaller than that of the to-be-laminated 2G-HTS tape.

In some embodiments, in step (S2), a first locally oxidized layer on the first lamination tape and a second locally oxidized layer on the second lamination tape formed by local oxidation each have a thickness of 100-500 nm; a density of each lattice is 25-2500/mm$^2$, and a diameter of oxidation points is 10-50 μm; line segments of the first locally oxidized layer are configured to extend along a width direction of the first lamination tape, and have a width of 10-50 μm and a spacing of less than 50 μm; and line segments of the second locally oxidized layer are configured to extend along a width direction of the first lamination tape, and have a width of 10-50 μm and a spacing of less than 50 μm.

In some embodiments, in step (S3), the to-be-laminated 2G-HTS tape has a structure of copper/silver/superconducting layer/buffer layer/metal substrate/silver/copper arranged in sequence.

In some embodiments, in step (S4), there is a first solder layer between the to-be-laminated 2G-HTS tape and the first lamination tape and a second solder layer between the to-be-laminated 2G-HTS tape and the second lamination tape; and the first solder layer and the second solder layer each have a thickness of 5-20 μm, and are independently made of lead-tin alloy, tin-bismuth alloy or silver-copper-tin alloy.

Compared to the prior art, the present disclosure has the following beneficial effects.

1. The 2G-HTS tape fabricated by the method provided herein has an irreversible tensile strain of not less than 0.7% at a liquid nitrogen temperature or below when tested by uniaxial tensile technique. Compared with other 2G-HTS tapes, the irreversible tensile strain of the 2G-HTS tape fabricated herein is increased by 50% or more.

2. In the presence of locally oxidized regions, under uniaxial tensile strain conditions, the holes at the interface between the solder layer and the lamination tape will crack and expand in the solder layers to release the stress, thereby resulting in local delamination between the superconducting tape and the lamination tapes. In this case, the superconducting layer is effectively protected, and the irreversible tensile strain of the 2G-HTS tape is improved.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Other features, objects and advantages of the present disclosure will become more apparent from the description of unrestrictive embodiments with reference to the following drawings.

Figure 1:
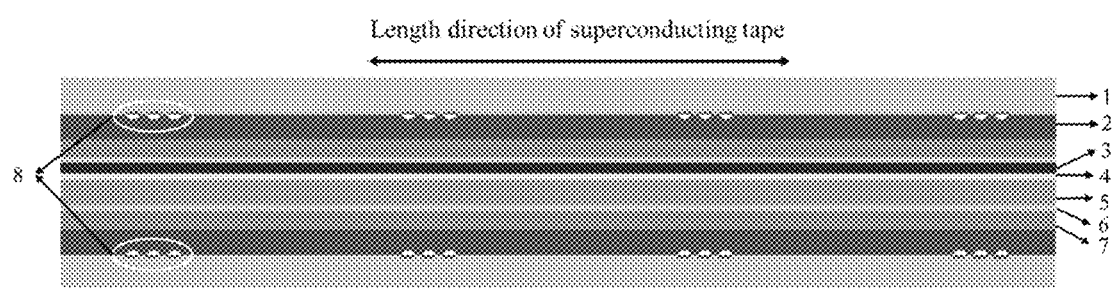
FIG. 1 is a cross-sectional view of a 2G-HTS tape lamination structure in accordance with an embodiment of the present disclosure.

In the drawings:
1. first lamination tape; 2. first solder layer; 3. superconducting layer; 4. buffer layer; 5. metal substrate; 6. silver layer; 7. copper layer; 8. microscopic hole; 9. lamination edge; 10. superconducting tape; and 11. locally oxidized region.

DETAILED DESCRIPTION OF EMBODIMENTS

This application will be described in detail below with reference to embodiments of this application. The following embodiments are intended to help those skilled in the art to further understand the present disclosure, and are not intended to limit the scope of the application in any form. It should be noted that any modifications, changes and replacements made by those of ordinary skill in the art without departing from the spirit of the disclosure shall fall within the scope of the disclosure defined by the appended claims.

Figure 2:
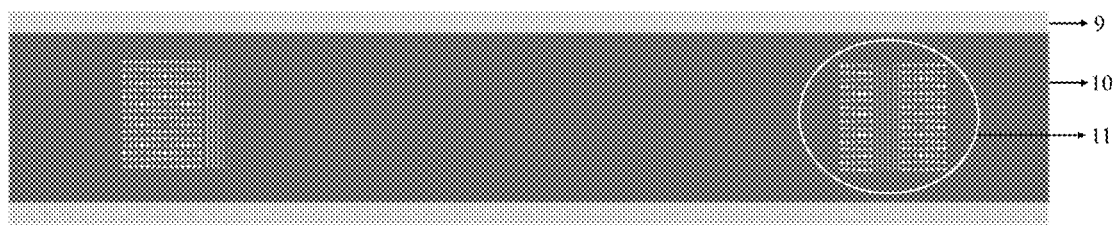
FIG. 2 is a top view of a 2G-HTS tape in accordance with an embodiment of the present disclosure.
Figure 3:
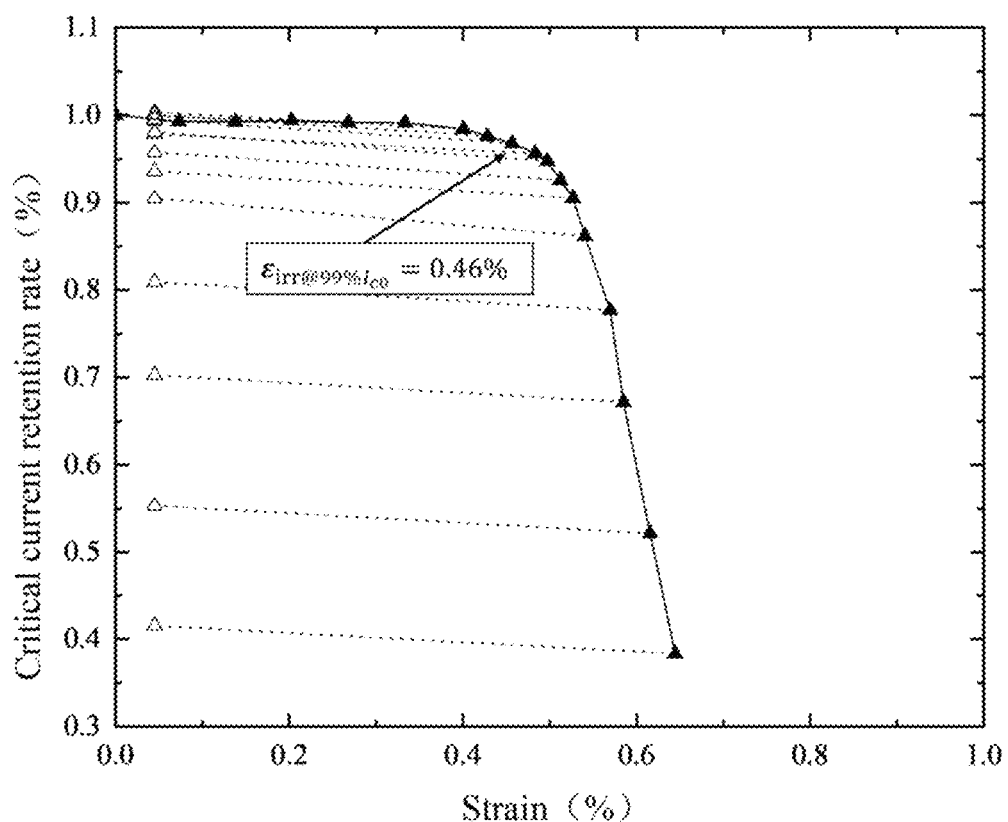
FIG. 3 shows a critical current retention rate of the existing 2G-HTS tape under different tensile strains.

As illustrated in FIGS. 1-5, a lamination structure of a 2G-HTS tape is provided. The lamination structure includes a lamination tape 1, a solder layer 2, a copper layer 7, a silver layer 6, a superconducting layer 3, a buffer layer 4, a metal substrate 5, another silver layer 6, another copper layer 7, another solder layer 2 and another lamination tape 1, which are connected through a low-temperature solder to form a sandwich structure. There are microscopic holes 8 at an interface between each of the lamination tape 1 and the solder layer 2. As shown in FIG. 2, lamination edges are located at two sides of a superconducting tape 10, respectively. The superconducting tape 10 has a locally oxidized region 11.

A method for fabricating the lamination structure of the 2G-HTS tape is also provided, which includes the following steps.

Step (1) Suitable lamination tapes are selected as a first lamination tape and a second lamination tape according to a specification of a to-be-laminated 2G-HTS tape.

Step (2) One side of the first lamination tape and one side of the second lamination tape are respectively subjected to local oxidation to obtain locally oxidized regions having locally oxidized patterns.

Step (3) The first lamination tape, the to-be-laminated 2G-HTS tape and the second lamination tape are arranged in a certain order, where the locally-oxidized side of the first lamination tape and the locally-oxidized side of the second lamination tape respectively face toward the to-be-laminated 2G-HTS tape.

Step (4) The first lamination tape, the to-be-laminated 2G-HTS tape and the second lamination tape are simultaneously immersed in a molten solder pool, and subjected to reel-to-reel squeezing lamination to form the desired lamination structure.

In step (1), the first lamination tape and the second lamination tape are independently made of brass, copper or stainless-steel.

In step (1), the to-be-laminated 2G-HTS tape has a thickness of 20-150 μm and a width of 2-12 mm. The first lamination tape and the second lamination tape each have a thickness of 50-150 μm, and a width of each of the first lamination tape and the second lamination tape is 0.5-3 mm larger than that of the to-be-laminated 2G-HTS tape.

In step (2), the local oxidation includes the following steps. The first lamination tape and the second lamination tape are respectively dip-coated with a first organic protective layer and a second organic protective layer. The first organic protective layer at one side of the first lamination tape is locally etched to form a first locally oxidized pattern, and the second organic protective layer at one side of the second lamination tape is locally etched to form a second locally oxidized pattern. The etched side of the first lamination tape is subjected to local thermal oxidation to form a first locally oxidized layer. The first organic protective layer is removed to obtain the first lamination tape with the first locally oxidized pattern on one side. The etched side of the second lamination tape is subjected to local thermal oxidation to form a second locally oxidized layer. The second organic protective layer is removed to obtain the second lamination tape with the second locally oxidized pattern on one side.

In step (2), the locally oxidized pattern is a combination of lattice and line segments, accounting for 5%-20% of an area of the lamination tape, and is located in a middle area of the lamination tape. A width of the locally oxidized region is 0.2-1 mm smaller than that of the to-be-laminated 2G-HTS tape.

In step (2), the first locally oxidized layer on the first lamination tape and the second locally oxidized layer on the second lamination tape formed by local oxidation each have a thickness of 100-500 nm. The density of each lattice is 25-2500/mm$^2$ and a diameter of oxidation points is 10-50 μm. The line segments of the first locally oxidized layer are configured to extend along a width direction of the first lamination tape, and have a width of 10-50 μm and a spacing of less than 50 μm. The line segments of the second locally oxidized layer are configured to extend along a width direction of the first lamination tape, and had a width of 10-50 μm and a spacing of less than 50 μm.

In step (3), a structure of the to-be-laminated 2G-HTS tape is copper/silver/superconducting layer/buffer layer/metal substrate/silver/copper arranged sequentially.

In step (4), there are a first solder layer between the to-be-laminated 2G-HTS tape and the first lamination tape and a second solder layer between the to-be-laminated 2G-HTS tape and the second lamination tape. The first solder layer and the second solder layer each have a thickness of 5-20 μm, and are independently made of lead-tin alloy, tin-bismuth alloy or silver-copper-tin alloy.

The 2G-HTS tape fabricated by the above method is tested using uniaxial tensile technique at the liquid nitrogen temperature or below, and the irreversible tensile strain is 0.7% or more, which was increased by 50% or more compared with other 2G-HTS tapes.

In the lamination structure of the 2G-HTS tape and the method for fabricating the same of the disclosure, an inner surface of each of the lamination tapes is subjected to local thermal oxidation to form the locally oxidized layer. During laminating, the locally oxidized regions of the lamination layers have poor wettability in the molten solder, resulting in incomplete combination between the lamination layers and the solder layers and the presence of a large number of microscopic holes. Under uniaxial tensile strain conditions, the microscopic holes in the locally oxidized regions would first crack and expand in the solder layers to release stress, resulting in local delamination between the laminated superconducting tapes and the lamination layers. In this case, the superconducting layer is effectively protected, and the irreversible tensile strain of the 2G-HTS tape is improved. The 2G-HTS tape fabricated by the above method is tested using uniaxial tensile technique at the liquid nitrogen temperature or below, and the irreversible tensile strain is 0.7% or more, which is increased by 50% or more compared with other 2G-HTS tapes. The lamination structure fabricated by the method provided herein can significantly enhance the irreversible tensile strain of the 2G-HTS tapes.

Example 1

Provided herein was a method for fabricating a lamination structure of a 2G-HTS tape, which included the following steps.

Step (1) A to-be-laminated 2G-HTS tape had a thickness of 80 μm and a width of 4.8 mm. Red-copper lamination tapes with a thickness of 90 μm and a width of 6 mm were selected as a first lamination tape and a second lamination tape.

Step (2) One side of the first lamination tape and one side of the second lamination tape were respectively subjected to local oxidation to obtain locally oxidized regions having locally oxidized patterns. The locally oxidized pattern was a combination of lattice and line segments, accounting for 10% of an area of the lamination tape, and was located in a middle area of the lamination tape. The locally oxidized region had a width of 4 mm and a thickness of 300 nm, where a lattice density of the oxidized layer was 1600/mm$^2$ and a diameter of each oxidation point was 15 μm. Line segments of the oxidized layers extended along a width direction of the lamination tape. The line segments had a width of 30 μm, and a spacing between the line segments was 30 μm.

Step (3) The first lamination tape, the to-be-laminated 2G-HTS tape and the second lamination tape were arranged in a certain order, where the locally-oxidized side of the first lamination tape and the locally-oxidized side of the second lamination tape respectively faced toward the to-be-laminated 2G-HTS tape. A structure of the to-be-laminated 2G-HTS tape was copper/silver/superconducting layer/buffer layer/metal substrate/silver/copper arranged sequentially.

Step (4) The first lamination tape, the to-be-laminated 2G-HTS tape and the second lamination tape were simultaneously immersed in a molten solder pool, and subjected to reel-to-reel squeezing lamination to form the desired lamination structure, where the solder was lead-tin alloy, and a thickness of the solder layer was 10 μm.

Figure 4:
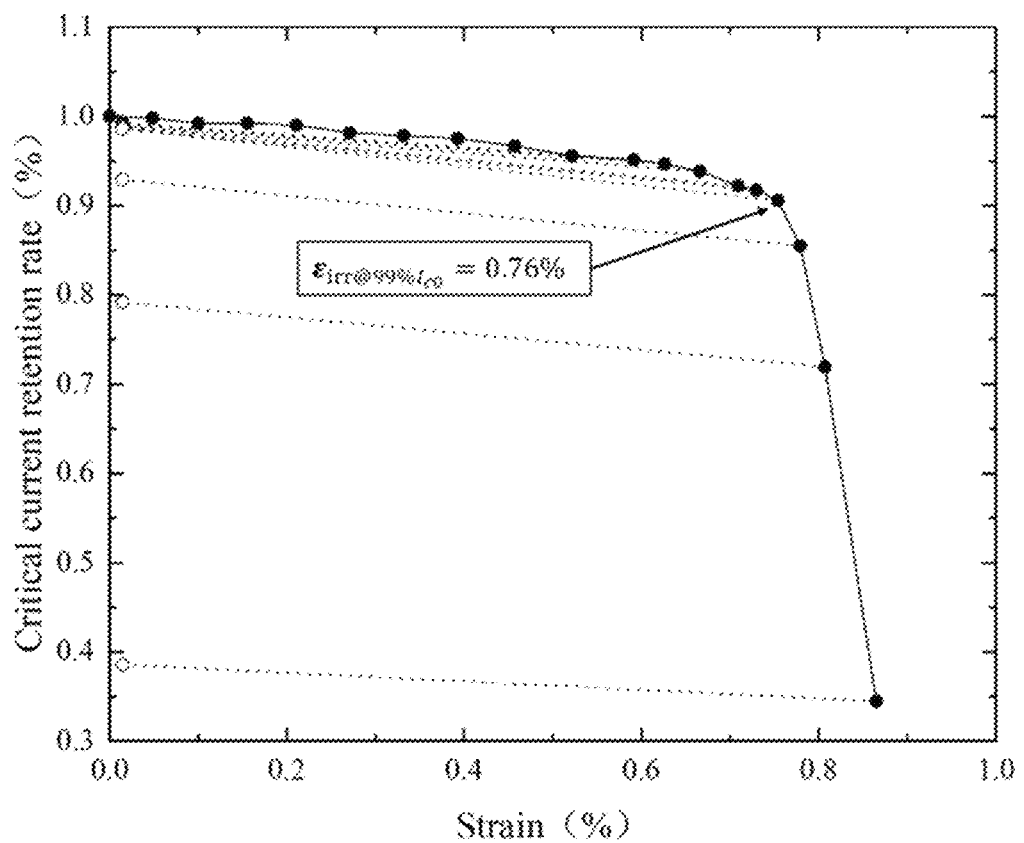
FIG. 4 schematically shows a relationship between a tensile strain and a critical current retention rate of a laminated-structure 2G-HTS tape fabricated in accordance with Example 1 of the present disclosure.

FIG. 4 schematically showed a relationship between a tensile strain and a critical current retention rate of the lamination structure fabricated in Example 1 of the present disclosure. As illustrated in FIG. 4, the solid line represented the process of strain loading; the dotted lines represented the process of strain unloading; and the right ends of the dotted lines represented the critical current retention rates after the corresponding stress was completely unloaded. The 2G-HTS tape fabricated by the above method was tested using uniaxial tensile technique at the liquid nitrogen temperature or below, and the irreversible tensile strain was 0.76%.

Figure 5:
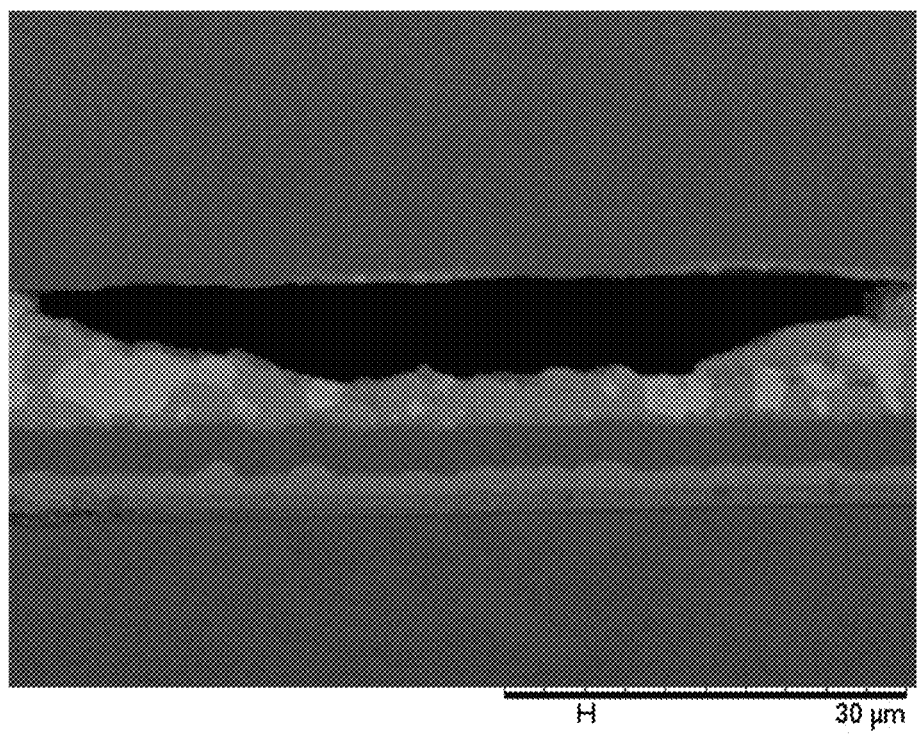
FIG. 5 is a scanning electron microscope (SEM) image of cross sections of microscopic holes of a laminated-structure 2G-HTS tape fabricated in accordance with Example 1 of the present disclosure.

FIG. 5 is an SEM image of cross sections of microscopic holes of the laminated-structure 2G-HTS tape in Example 1 of the present disclosure. As shown in FIG. 5, the locally oxidized regions of lamination layers had poor wettability in the molten solder, resulting in incomplete bonding between the lamination layers and solder layers, and the presence of a large number of microscopic holes. Under uniaxial tensile strain conditions, the microscopic holes will first crack and expand in the solder layers to release stress, resulting in local delamination between the laminated superconducting tape and the lamination layers. In this case, the superconducting layer was protected, and the irreversible tensile strain of the 2G-HTS tape was enhanced.

Example 2

Provided herein was a method for fabricating a lamination structure of a 2G-HTS tape, which included the following steps.

Step (1) A to-be-laminated 2G-HTS tape had a thickness of 150 μm and a width of 12 mm. Stainless-steel lamination tapes with a thickness of 150 μm and a width of 15 mm were selected as a first lamination tape and a second lamination tape.

Step (2) One side of the first lamination tape and one side of the second lamination tape were respectively subjected to local oxidation to obtain locally oxidized regions having locally oxidized patterns. The locally oxidized pattern was a combination of lattice and line segments, accounting for 5% of an area of the lamination tape, and was located in a middle area of the lamination tape. The locally oxidized region had a width of 11 mm and a thickness of 500 nm, where a lattice density of the oxidized layer was $2500/mm^2$ and a diameter of each oxidation point was 10 μm. Line segments of the oxidized layers extended along a width direction of the lamination tape. The line segments had a width of 50 μm, and a spacing between the line segments was 50 μm.

Step (3) The first lamination tape, the to-be-laminated 2G-HTS tape and the second lamination tape were arranged in a certain order, where the locally-oxidized side of the first lamination tape and the locally-oxidized side of the second lamination tape respectively faced toward the to-be-laminated 2G-HTS tape. A structure of the to-be-laminated 2G-HTS tape is copper/silver/superconducting layer/buffer layer/metal substrate/silver/copper arranged sequentially.

Step (4) The first lamination tape, the to-be-laminated 2G-HTS tape and the second lamination tape were simultaneously immersed in a molten solder pool, and subjected to reel-to-reel squeezing lamination to form the desired lamination structure, where the solder was lead-tin alloy, and a thickness of the solder layer was 20 μm.

The 2G-HTS tape fabricated by the above method was tested using uniaxial tensile technique at the liquid nitrogen temperature or below, and the irreversible tensile strain was 0.73%.

Example 3

Provided herein was a method for fabricating a lamination structure of a 2G-HTS tape, which included the following steps.

Step (1) A to-be-laminated 2G-HTS tape had a thickness of 20 μm and a width of 2 mm. Copper lamination tapes with a thickness of 50 μm and a width of 2.5 mm were selected as a first lamination tape and a second lamination tape.

Step (2) One side of the first lamination tape and one side of the second lamination tape were respectively subjected to local oxidation to obtain locally oxidized regions having locally oxidized patterns. The locally oxidized pattern was a combination of lattice and line segments, accounting for 20% of an area of the lamination tape, and was located in a middle area of the lamination tape. The locally oxidized region had a width of 1.8 mm and a thickness of 100 nm, where a lattice density of the oxidized layer was $25/mm^2$ and a diameter of each oxidation point was 50 μm. Line segments of the oxidized layers extended along a width direction of the lamination tape. The line segments had a width of 10 μm, and a spacing between the line segments was 20 μm.

Step (3) The first lamination tape, the to-be-laminated 2G-HTS tape and the second lamination tape were arranged in a certain order, where the locally-oxidized side of the first lamination tape and the locally-oxidized side of the second lamination tape respectively faced toward the to-be-laminated 2G-HTS tape. A structure of the to-be-laminated 2G-HTS tape is copper/silver/superconducting layer/buffer layer/metal substrate/silver/copper arranged sequentially.

Step (4) The first lamination tape, the to-be-laminated 2G-HTS tape and the second lamination tape were simultaneously immersed in a molten solder pool, and subjected to reel-to-reel squeezing lamination to form the desired lamination structure, where the solder was lead-tin alloy, and a thickness of the solder layer was 5 μm.

The 2G-HTS tape fabricated by the above method was tested using uniaxial tensile technique at the liquid nitrogen temperature or below, and the irreversible tensile strain was 0.8%.

Comparative Example 1

The difference between Comparative Example 1 and Example 1 was that the superconducting tape was not laminated in Comparative Example 1. A 2G-HTS tape fabricated herein was tested using uniaxial tensile technique at the liquid nitrogen temperature or below, and the irreversible tensile strain was 0.46%.

Comparative Example 2

The difference between Comparative Example 2 and Example 1 was that the lamination layers of Comparative Example 2 were directly laminated without subjecting to local oxidation of step (2). A 2G-HTS tape fabricated herein was tested using uniaxial tensile technique at the liquid nitrogen temperature or below, and the irreversible tensile strain was 0.43%.

Comparative Example 3

The difference between Comparative Example 3 and Example 1 was that in step (2) of Comparative Example 3, an area of the local oxidation was 50%. In the uniaxial tensile test, the lamination layer of a 2G-HTS tape fabricated herein was completely peeled off, and cannot be used in practical applications.

Comparative Example 4

The difference between Comparative Example 4 and Example 1 was that in step (2) of Comparative Example 4, a width of the local oxidation was 5.5 mm, which was larger than that of inner-laminated superconducting tapes, and the local oxidation was not located in a middle area of the lamination tape. A 2G-HTS tape fabricated herein was subject to leakage of the solder layer, and was not firmly bonded for use in practical applications.

Comparative Example 5

The difference between Comparative Example 5 and Example 1 was that in step (2) of Comparative Example 5, a thickness of the local oxidation was 3 μm. A 2G-HTS tape fabricated herein had a remarkable "bird's beak effect" in locally oxidized layers, that was, the locally oxidized layers diffused to the surroundings, resulting in an excessively large locally oxidized area. In the uniaxial tensile test, the lamination layer of a 2G-HTS tape fabricated herein was completely peeled off, and cannot be used in practical applications.

In summary, the lamination structure fabricated by the method provided herein can significantly enhance the irreversible tensile strain of the 2G-HTS tapes.

It should be noted that in this application, the orientation or position relationships indicated by terms such as "upper", "lower", "front", "back", "left", "right", "vertical", "horizontal", "top", "bottom", "inner", "outer", etc. are based on the orientation or position relationships shown in the drawings, which are merely for the convenience of describing the present application and simplifying the description, but not intended to indicate or imply that the device or element referred to must have a particular orientation, or be constructed or operated in a particular orientation, and therefore cannot be construed as a limitation of the present application.

Described above are merely illustrative of the present application, and are not intended to limit the present application. It should be understood that various changes and modifications made by those skilled in the art without departing from the spirit of the disclosure shall fall within the scope of the disclosure defined by the appended claims. The embodiments of the present application and the features therein can be combined with each other arbitrarily in the absence of contradiction.

What is claimed is:

1. A lamination structure of a second generation high-temperature superconducting (2G-HTS) tape, comprising:
   a lamination tape group; and
   a to-be-laminated 2G-HTS tape;
   wherein the lamination tape group comprises a first lamination tape and a second lamination tape;
   the first lamination tape, the to-be-laminated 2G-HTS tape and the second lamination tape are connected through a solder;
   a side of the first lamination tape facing toward the to-be-laminated 2G-HTS tape is provided with a first locally oxidized region, and a side of the second lamination tape facing toward the to-be-laminated 2G-HTS tape is provided with a second locally oxidized region;
   the first lamination tape is coated with a first organic protective layer, and the second lamination tape is coated with a second organic protective layer; a first locally oxidized pattern is formed by etching the first organic protective layer within the first locally oxidized region; a second locally oxidized pattern is formed by etching the second organic protective layer within the second locally oxidized region;
   an area of the first locally oxidized pattern accounts for 5%-20% of an area of the first lamination tape, and an area of the second locally oxidized pattern accounts for 5%-20% of an area of the second lamination tape; the first locally oxidized pattern is located at a middle of the first lamination tape, and the second locally oxidized pattern is located at a middle of the second lamination tape; and a width of the first locally oxidized region and a width of the second locally oxidized region are each 0.2-1 mm smaller than that of the to-be-laminated 2G-HTS tape; and
   a first locally oxidized layer formed in the first locally oxidized region by local oxidation and a second locally oxidized layer formed in the second locally oxidized region by local oxidation each have a thickness of 100-500 nm; a density of each lattice is 25-2500/mm$^2$, and a diameter of oxidation points is 10-50 μm; line segments of the first locally oxidized layer are configured to extend along a width direction of the first lamination tape, and have a width of 10-50 μm and a spacing of less than 50 μm; and
   line segments of the second locally oxidized layer are configured to extend along a width direction of the first lamination tape, and have a width of 10-50 μm and a spacing of less than 50 μm.

2. A method for fabricating the lamination structure of claim 1, comprising:
   (S1) selecting a first lamination tape and a second lamination tape according to a specification of a to-be-laminated 2G-HTS tape;
   (S2) subjecting one side of the first lamination tape and one side of the second lamination tape to local oxidation respectively to obtain a first locally oxidized region with a first locally oxidized pattern and a second locally oxidized with a second locally oxidized pattern;
   (S3) sequentially arranging the first lamination tape, the to-be-laminated 2G-HTS tape, and the second lamination tape, wherein the side of the first lamination tape locally oxidized faces towards the to-be-laminated 2G-HTS tape, and the side of the second lamination tape locally oxidized faces toward the to-be-laminated 2G-HTS tape; and
   (S4) immersing the first lamination tape, the to-be-laminated 2G-HTS tape and the second lamination tape simultaneously in a molten solder pool followed by reel-to-reel squeezing lamination to form the lamination structure.

3. The method of claim 2, wherein in step (S1), the first lamination tape and the second lamination tape are independently made of brass, copper or stainless-steel.

4. The method of claim 2, wherein in step (S1), the to-be-laminated 2G-HTS tape has a thickness of 20-150 μm and a width of 2-12 mm; and the first lamination tape and the second lamination tape each have a thickness of 50-150 μm, and a width of each of the first lamination tape and the second lamination tape is 0.5-3 mm larger than that of the to-be-laminated 2G-HTS tape.

5. The method of claim 2, wherein in step (S2), the local oxidation comprises:
   dip-coating the first lamination tape and the second lamination tape in an organic protective solution to form a first organic protective layer and a second organic protective layer, respectively, locally etching the first organic protective layer at one side of the first lamination tape to form a first locally oxidized pattern, and locally etching the second organic protective layer at one side of the second lamination tape to form a second locally oxidized pattern; and performing local thermal oxidation on the side of the first lamination tape to form a first locally oxidized layer followed by removal of the first organic protective layer to obtain the first lamination tape with the first locally oxidized pattern on one side; and performing local thermal oxidation on the side of the second lamination tape to form a second locally oxidized layer followed by removal of the second organic protective layer to obtain the second lamination tape with the second locally oxidized pattern on one side.

6. The method of claim 2, wherein in step (S2), each of the first locally oxidized pattern and the second locally oxidized pattern is a combination of lattice and line segments.

7. The method of claim 2, wherein in step (S3), the to-be-laminated 2G-HTS tape has a structure of copper/silver/superconducting layer/buffer layer/metal substrate/silver/copper arranged in sequence.

8. The method of claim 2, wherein in step (S4), there is a first solder layer between the to-be-laminated 2G-HTS tape and the first lamination tape and a second solder layer between the to-be-laminated 2G-HTS tape and the second lamination tape; and the first solder layer and the second solder layer each have a thickness of 5-20 μm, and are independently made of lead-tin alloy, tin-bismuth alloy or silver-copper-tin alloy.

* * * * *